US010811519B2

(12) United States Patent
Huang et al.

(10) Patent No.: US 10,811,519 B2
(45) Date of Patent: *Oct. 20, 2020

(54) SEMICONDUCTOR DEVICE GATE SPACER STRUCTURES AND METHODS THEREOF

(71) Applicant: Taiwan Semiconductor Manufacturing Co., Ltd., Hsinchu (TW)

(72) Inventors: Kuo-Chang Huang, Hsinchu (TW); Fu-Peng Lu, Hsinchu (TW); Chun-Chang Liu, Hsinchu (TW); Chen-Chiu Huang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/429,144

(22) Filed: Jun. 3, 2019

(65) Prior Publication Data
US 2019/0288087 A1    Sep. 19, 2019

Related U.S. Application Data

(63) Continuation of application No. 15/891,074, filed on Feb. 7, 2018, now Pat. No. 10,312,348.
(Continued)

(51) Int. Cl.
H01L 21/8234    (2006.01)
H01L 29/66    (2006.01)
H01L 21/02    (2006.01)
H01L 21/04    (2006.01)
H01L 21/306    (2006.01)
(Continued)

(52) U.S. Cl.
CPC ...... *H01L 29/6656* (2013.01); *H01L 21/0214* (2013.01); *H01L 21/0217* (2013.01); *H01L 21/0228* (2013.01); *H01L 21/02178* (2013.01); *H01L 21/02181* (2013.01); *H01L 21/02186* (2013.01); *H01L 21/02189* (2013.01); *H01L 21/02274* (2013.01); *H01L 21/02277* (2013.01); *H01L 21/046* (2013.01); *H01L 21/30617* (2013.01); *H01L 21/823864* (2013.01); *H01L 29/0847* (2013.01); *H01L 29/6653* (2013.01); *H01L 29/6659* (2013.01); *H01L 29/66545* (2013.01); *H01L 29/66636* (2013.01);
(Continued)

(58) Field of Classification Search
CPC .............................. H01L 21/823468
See application file for complete search history.

(56) References Cited

U.S. PATENT DOCUMENTS 5,153,145 A    10/1992 Lee et al.
5,369,297 A    11/1994 Kusnoki et al.
(Continued)

FOREIGN PATENT DOCUMENTS

KR    20160137772    12/2016

Primary Examiner — George R Fourson, III
(74) Attorney, Agent, or Firm — Haynes and Boone, LLP

(57) ABSTRACT

A semiconductor device includes a substrate having a channel region; a gate stack over the channel region; a seal spacer covering a sidewall of the gate stack, the seal spacer including silicon nitride; a gate spacer covering a sidewall of the seal spacer, the gate spacer including silicon oxide, the gate spacer having a first vertical portion and a first horizontal portion; and a first dielectric layer covering a sidewall of the gate spacer, the first dielectric layer including silicon nitride.

20 Claims, 18 Drawing Sheets

Related U.S. Application Data

(60) Provisional application No. 62/590,003, filed on Nov. 22, 2017.

(51) Int. Cl.
*H01L 29/08* (2006.01)
*H01L 29/78* (2006.01)
*H01L 21/8238* (2006.01)

(52) U.S. Cl.
CPC .. *H01L 29/7833* (2013.01); *H01L 21/823468* (2013.01); *H01L 29/665* (2013.01)

(56) References Cited

U.S. PATENT DOCUMENTS

| | | |
|---|---|---|
| 5,573,965 A | 11/1996 | Chen et al. |
| 5,731,239 A | 3/1998 | Wong et al. |
| 5,747,373 A | 5/1998 | Yu |
| 5,972,783 A | 10/1999 | Arai et al. |
| 6,087,235 A | 7/2000 | Yu |
| 6,180,988 B1 | 1/2001 | Wu |
| 6,239,471 B1 | 5/2001 | Shimizu et al. |
| 6,593,198 B2 | 7/2003 | Segawa |
| 9,318,571 B2 | 4/2016 | Wang et al. |
| 2006/0024873 A1 | 2/2006 | Nandakumar et al. |
| 2007/0267678 A1 | 11/2007 | Lo |
| 2009/0246927 A1 | 10/2009 | Wiatr et al. |
| 2010/0059801 A1 | 3/2010 | Kamei et al. |
| 2011/0237040 A1 | 9/2011 | Ng et al. |
| 2012/0153398 A1 | 6/2012 | Baars et al. |
| 2012/0241873 A1 | 9/2012 | Huang |
| 2013/0087837 A1 | 4/2013 | Chang et al. |
| 2018/0033866 A1 | 2/2018 | Liao et al. |
| 2018/0174904 A1 | 6/2018 | Hsieh et al. |
| 2019/0157419 A1 | 5/2019 | Huang et al. |

SEMICONDUCTOR DEVICE GATE SPACER STRUCTURES AND METHODS THEREOF

PRIORITY DATA

The present application is a continuation application of U.S. application Ser. No. 15/891,074, filed Feb. 7, 2018, which claims priority to U.S. Provisional Patent Application Ser. No. 62/590,003 entitled "Semiconductor Device Gate Spacer Structures and Methods Thereof," and filed Nov. 22, 2017, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, it is generally desired to reduce stray capacitance among features of field effect transistors, such as capacitance between a gate structure and source/drain contacts, in order to increase switching speed, decrease switching power consumption, and/or decrease coupling noise of the transistors. Certain low-k materials have been suggested as insulator materials surrounding gate structures so as to provide lower dielectric constant (or relative permittivity) and reduce stray capacitance. However, as semiconductor technology progresses to smaller geometries, the distances between the gate structure and source/drain contacts are further reduced, resulting in still large stray capacitance. Therefore, although existing approaches in transistor formation have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
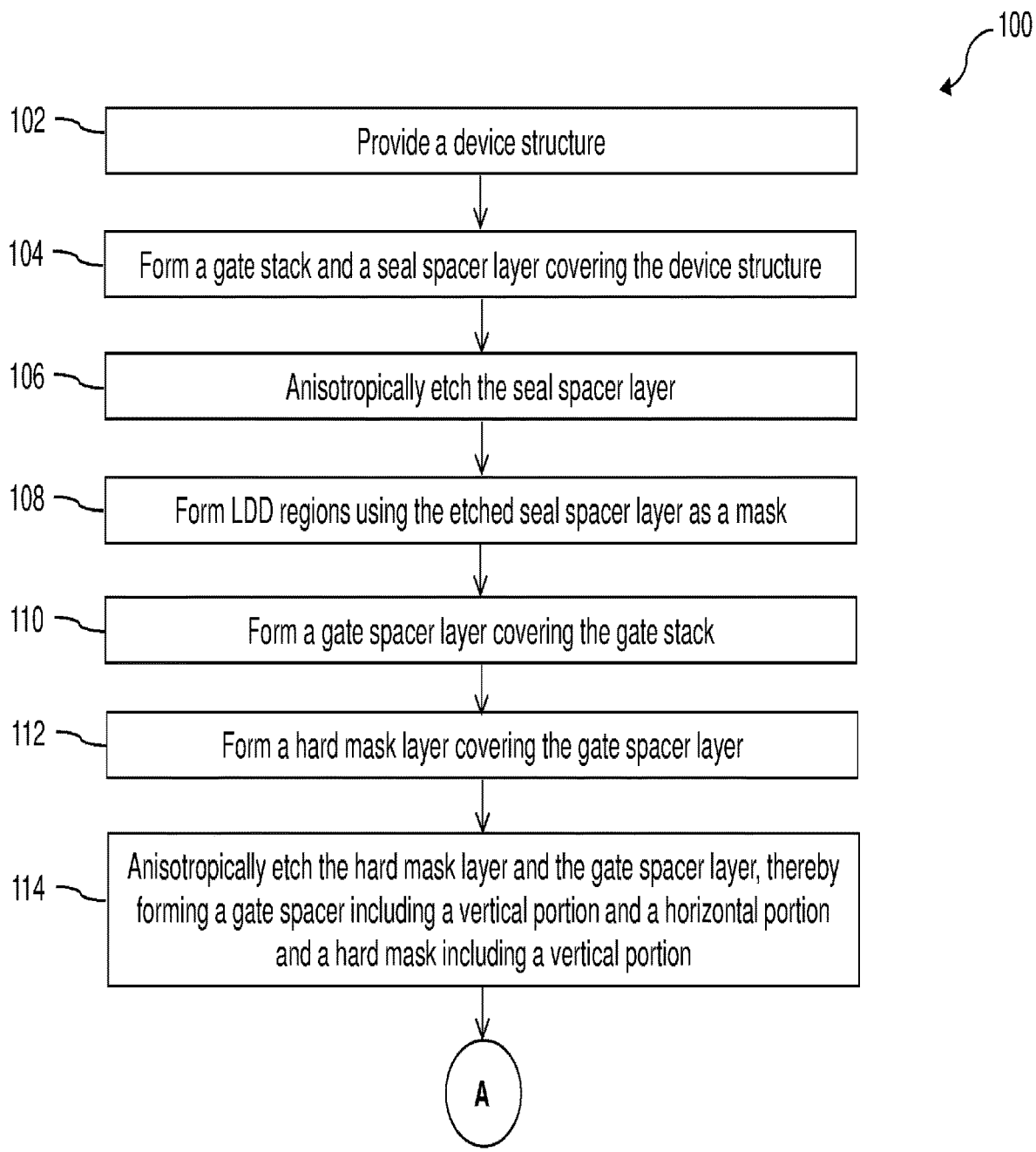
FIGS. 1A, 1B, and 1C show a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to providing low-k gate spacer structures and methods thereof for lowering stray capacitance between a gate structure and source/drain contacts of field effect transistors (FETs) in semiconductor manufacturing. When forming FETs, it is desired to increase switching speed, decrease switching power consumption, and decrease coupling noise. Stray capacitance generally has a negative impact on these parameters, especially by the stray capacitance between a gate structure and source/drain contacts. As semiconductor technology progresses to smaller geometries, the distances between the gate and source/drain contacts shrink, resulting in larger stray capacitance. Consequently, stray capacitance in FETs has become more problematic. The present disclosure provides solutions in forming low-k gate spacer structures surrounding gate stacks, such as poly gates or metal gates. Compared with gate spacers conventionally made of silicon nitride (e.g., $Si_3N_4$), the low-k gate spacer structures lower the dielectric constant (or relative permittivity) between the gate stack and source/drain contacts, thereby lowering the stray capacitance thereof. Furthermore, the low-k gate spacer structures help decrease interface stress between gate stacks and source/drain regions and therefore improve channel carrier mobility.

Figure 1B:
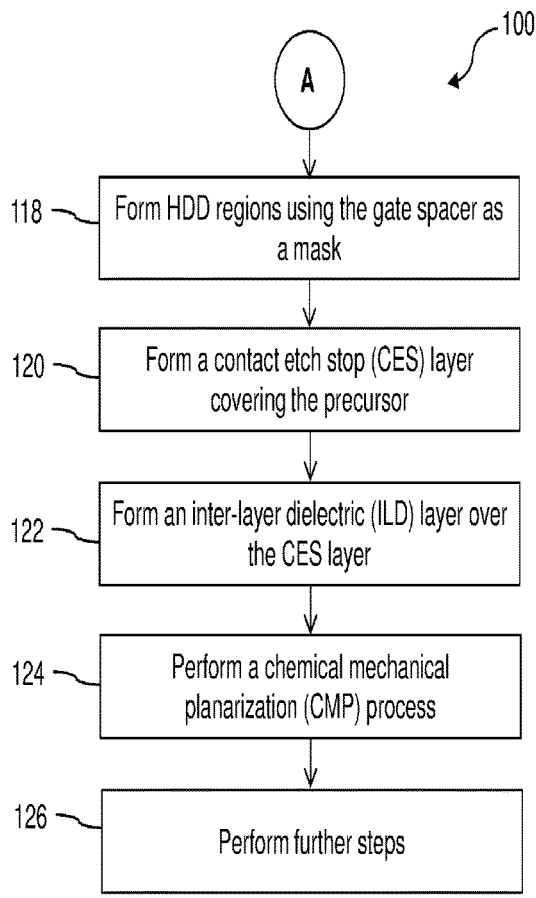
Figure 1C:
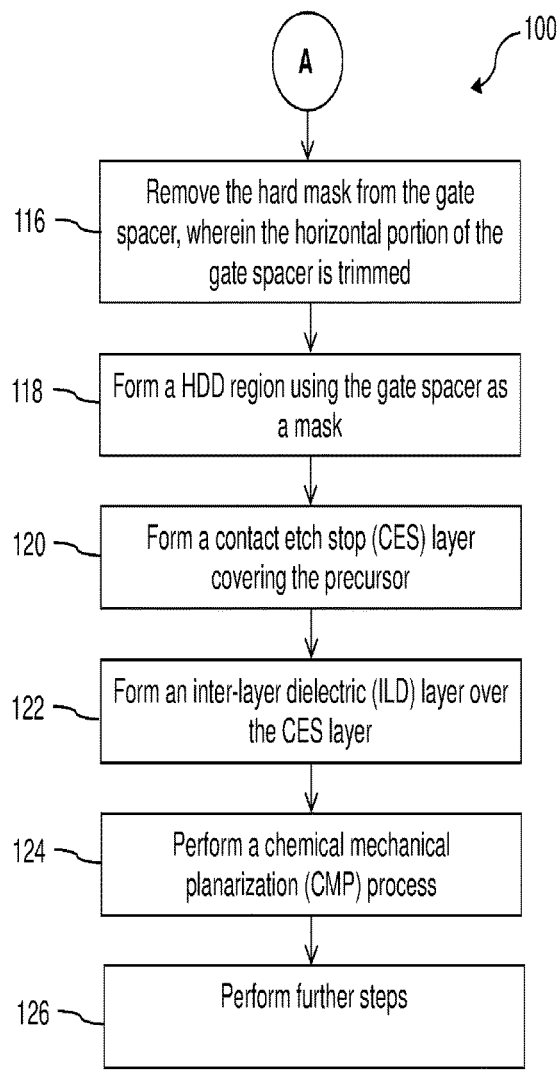

FIGS. 1A, 1B, and 1C illustrate a flow chart of a method 100 for forming semiconductor devices according to the present disclosure. The method 100 is an example, and is not intended to limit the present disclosure beyond what is explicitly recited in the claims. Additional operations can be provided before, during, and after the method 100, and some operations described can be replaced, eliminated, or relocated for additional embodiments of the method. The method 100 is described below in conjunction with FIGS. 2-16, which illustrate cross-sectional views of a semiconductor device 200 during various fabrication steps according to some embodiments of the method 100.

The device 200 may be an intermediate device fabricated during processing of an integrated circuit (IC), or a portion thereof, that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Figure 2:
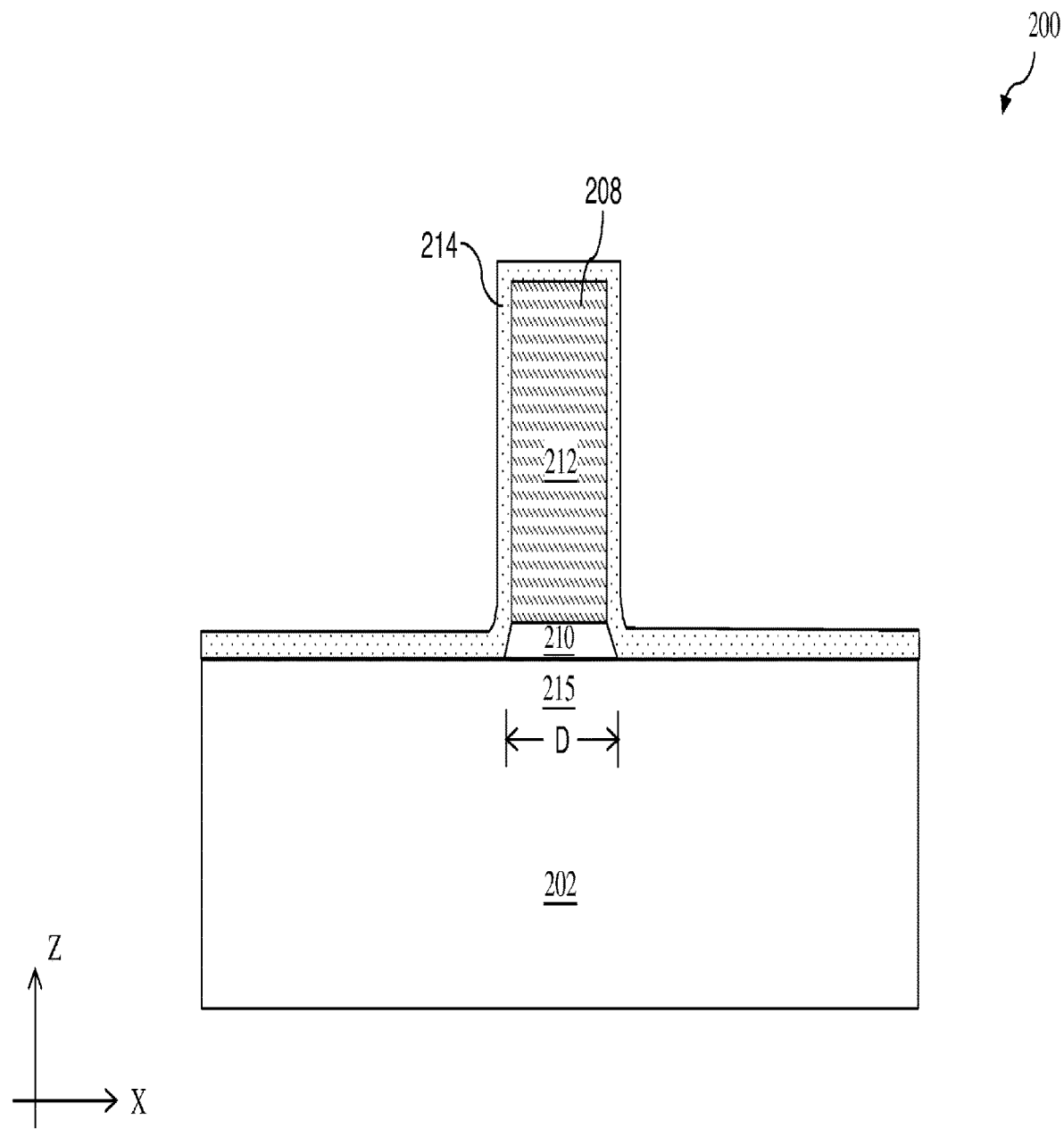
FIGS. 2, 3, 4, 5, 6, 7, 8, 9, 10, 11, 12, 13, 14, 15, 16, and 17 are cross-sectional views of a portion of a semiconductor device during a fabrication process according to the method of FIGS. 1A, 1B, and 1C, in accordance with some embodiments.

At operation 102, the method 100 (FIG. 1A) provides a device structure 200 (FIG. 2). For the convenience of discussion, the device structure 200 is also referred to as the device 200. The device 200 may include a substrate 202 and various features formed therein or thereon. The substrate 202 is a silicon substrate in the illustrated embodiment. Alternatively, the substrate 202 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor on insulator (SOI). In some embodiments, the substrate 202 includes fin-like semiconductor regions ("fins") for forming FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 202 and patterned using a photolithography process. Spacers are formed alongside the patterned sacrificial layer using a self-aligned process. The sacrificial layer is then removed, and the remaining spacers, or mandrels, may then be used to pattern the substrate 202 to form the fins. The fins may include one or more layers of epitaxially grown semiconductor materials in some embodiments.

In some embodiments, the substrate 202 includes an insulator (or an isolation structure) that may be formed of silicon oxide, silicon nitride, silicon oxynitride, fluoride-doped silicate glass (FSG), a low-k dielectric material, and/or other suitable insulating material. The insulator may be shallow trench isolation (STI) features. In an embodiment, the insulator is formed by etching trenches in the substrate 202 (for example, as part of the fin formation process discussed above), filling the trenches with an insulating material, and performing a chemical mechanical planarization (CMP) process to the substrate 202 including the insulating material. The substrate 202 may include other isolation structure(s) such as field oxide and LOCal Oxidation of Silicon (LOCOS). The substrate 202 may include a multi-layer isolation structure.

At operation 104, the method 100 (FIG. 1A) forms a gate stack 208 over the substrate 202 (FIG. 2). In various embodiments, the gate stack 208 is a multi-layer structure. In some embodiments, the gate stack 208 is a polysilicon gate structure, including an interfacial layer 210 having silicon oxide or silicon oxynitride and an electrode layer 212 having polysilicon. Accordingly, in some embodiments, forming the gate stack 208 includes depositing the interfacial layer 210 over the substrate 202 by chemical oxidation, thermal oxidation, atomic layer deposition (ALD), chemical vapor deposition (CVD), or other suitable methods; depositing the electrode layer 212 over the interfacial layer 210 by low pressure chemical vapor deposition (LPCVD), or other suitable methods; and subsequently patterning the interfacial layer 210 and the electrode layer 212 in a lithographic process to form the gate stack 208. The gate stack 208 defines a channel region 215 thereunder in the substrate 202 or in a fin of the substrate 202. In the illustrated embodiment, the channel region 215 has a channel length D, ranging from about 5 nm to about 180 nm.

In a particular embodiment, the method 100 includes a replacement gate process which will be further described in details later. In the replacement gate process, the gate stack 208 is a temporary gate structure. The interfacial layer 210 may be a temporary interfacial layer having silicon oxide or silicon oxynitride, and the electrode layer 212 may be a temporary electrode layer having polysilicon.

Operation 104 may further include forming a seal spacer layer 214 covering the device 200. In the illustrated embodiment, the seal spacer layer 214 is deposited as a blanket layer over top and sidewalls of the gate stack 208 and over a top surface of the substrate 202. To further the illustrated embodiment, the seal spacer layer 214 includes silicon nitride (e.g., $Si_3N_4$), and may be deposited using plasma-enhanced chemical vapor deposition (PECVD), LPCVD, ALD, or other suitable methods. The seal spacer layer 214 may be deposited to a thickness of about 0.5 nm to about 10 nm, such as about 3 nm.

Figure 3:
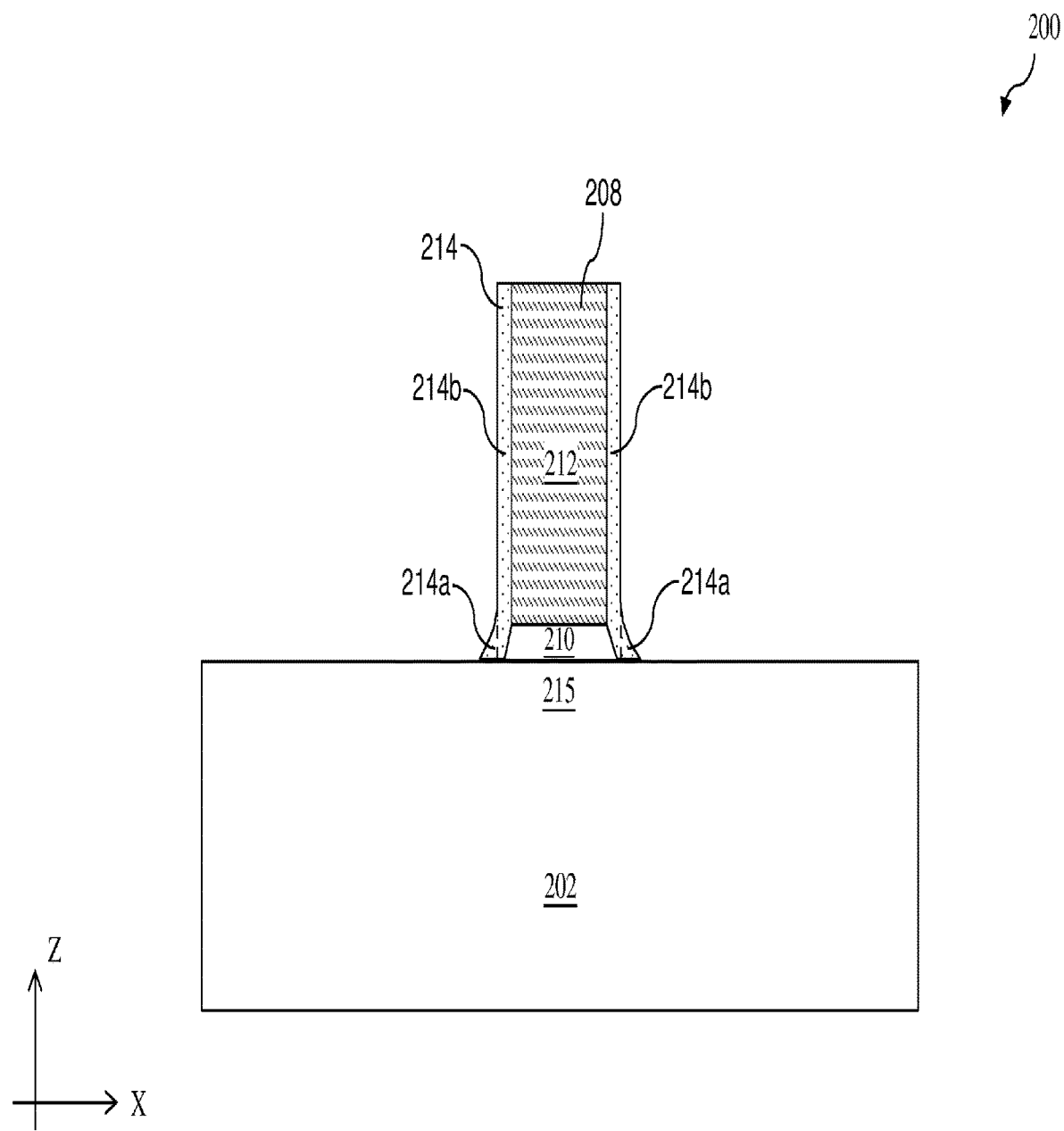

At operation 106, the method 100 (FIG. 2A) applies an anisotropic etching process to the seal spacer layer 214 (FIG. 3). The anisotropic etching process is designed to selectively etch the seal spacer layer 214 but does not etch the substrate 202. The operation 106 removes portions of the seal spacer layer 214 from the top surface of the substrate 202, thereby exposing the top surface of the substrate 202. The portion of the seal spacer layer 214 on the sidewalls of the gate stack 208 remains substantially un-etched due to the highly directional etching. Further, the top surface of the gate stack 208 may or may not be exposed by this anisotropic etching process. In an embodiment where the seal spacer layer 214 includes silicon nitride, operation 106 may employ a remote $O_2/N_2$ discharge with a fluorine-containing gas such as $CF_4$, $NF_3$, or $SF_6$, and may additionally include hydrogen ($H_2$) or $CH_4$. Various other methods of selectively etching the seal spacer layer 214 are possible. The patterned seal spacer layer 214 can be denoted as the seal spacer 214 for the sake of simplicity. In a particular embodiment, the seal spacer 214 is conformal to the sidewall of the gate stack 208 and has a tapering profile close to the bottom of the gate stack 208. Thus, the seal spacer 214 may be considered as including a horizontal portion 214a due to the tapering profile and a vertical portion 214b. The horizontal portion 214a connects to the bottom of the vertical portion 214b and extends laterally in a direction away from the gate stack 208. The horizontal portion 214a may have a width (along the X axis) of about 0.5 nm to about 5 nm, such as about 3 nm.

Figure 4:
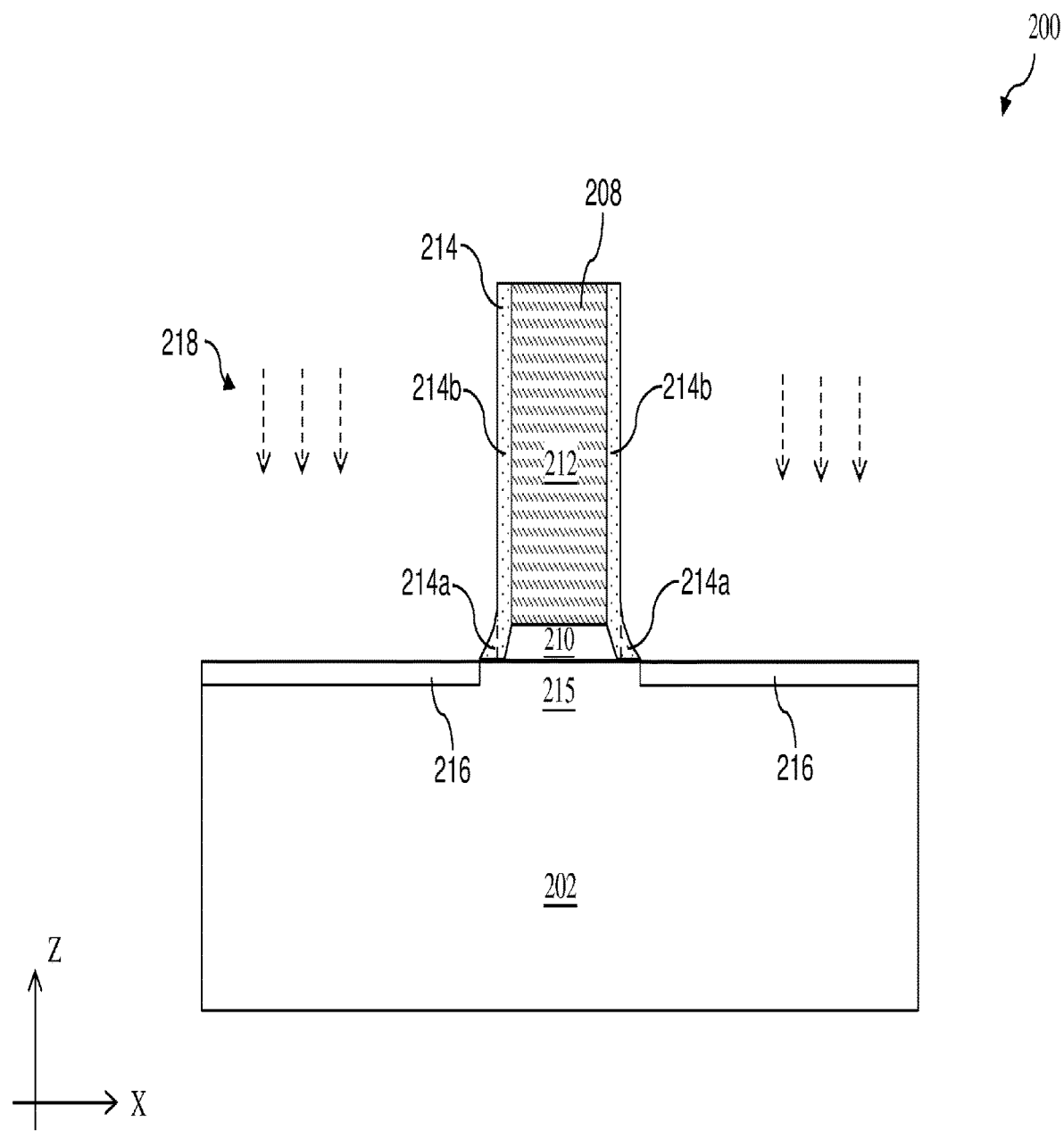

At operation 108, the method 100 (FIG. 1A) forms lightly doped source/drain (LDD) regions 216 in the substrate 202 by performing ion implantation process 218 (FIG. 4). The ion implantation process 218 may utilize n-type dopants, such as phosphorus (P) or arsenic (As), for the NFETs, or p-type dopants, such as boron (B) or indium (In), for the PFETs. The LDD regions 216 are self-aligned with the gate stack 208 and the seal spacer 214. A mask layer (not shown) may be used to cover other regions of the substrate 202 when the LDD regions 216 are subject to the ion implantation process 218. In some embodiments, the mask layer is a patterned photoresist. In some embodiments, the mask layer is a patterned hard mask of a material, such as silicon oxide, silicon nitride, silicon oxynitride or a combination thereof. The mask layer is removed after the LDD implantation has completed in the LDD regions 216. In the embodiment depicted in FIG. 4, operation 108 is performed after operation 106. In an alternative embodiment, operation 108 is performed before operation 106.

Figure 5:
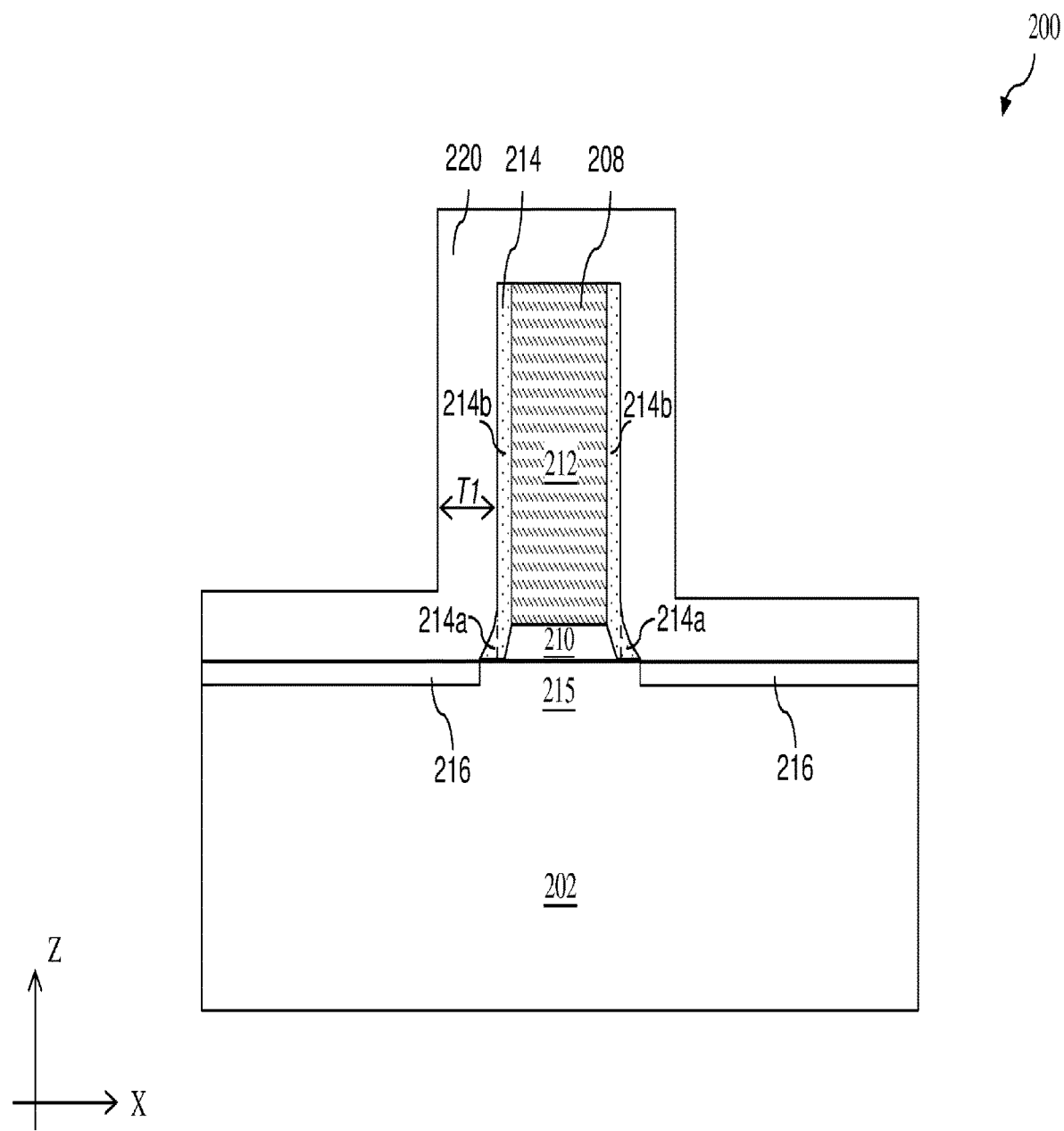

At operation 110, the method 100 (FIG. 1A) forms a gate spacer layer 220 covering the device 200 (FIG. 5). In the illustrated embodiment, the gate spacer layer 220 is deposited as a blanket layer over sidewalls of the seal spacer 214, over top of the gate stack 208, and over the top surface of the substrate 202. In some devices, silicon nitride has been used as a material for gate spacers in semiconductor manufacturing. However, silicon nitride has a relatively high dielectric constant that is usually within a range of 6.8-8.3, such as about 7.5, which leads to a high stray capacitance between a gate stack and source/drain contacts and/or other FET features in some instances. To decrease stray capacitance, there is a need to use materials with relatively low dielectric constants, other than silicon nitride, for gate spacers. In one embodiment, the gate spacer layer 220 includes silicon oxide (e.g., $SiO_2$). Silicon oxide has a lower dielectric constant than silicon nitride, which is usually within a range of 3.4-4.2, such as about 3.9. In some embodiments, the deposition of the gate spacer layer 220 includes introducing a silicon-containing compound and an oxygen-containing compound that react to form a dielectric material. The gate spacer layer 220 may include undoped silicate glass (USG), fluoride-doped silicate glass (FSG), phosphosilicate glass (PSG), or borophosphosilicate glass (BPSG). In another embodiment, the gate spacer layer 220 includes germanium oxide (e.g., $GeO_2$). The gate spacer layer 220 may be formed by any suitable technique including PECVD, LPCVD, and ALD. In the illustrated embodiment, the gate spacer layer 220 includes silicon dioxide and is deposited by a conformal deposition technique, such as an ALD process. The gate spacer layer 220 may be deposited to a thickness $T_1$ that is in a ratio of about 10% to about 70% of the channel region 215's length D. In some embodiments, the thickness $T_1$ is within a range of about 3 nm to about 20 nm, such as about 5 nm.

Figure 6:
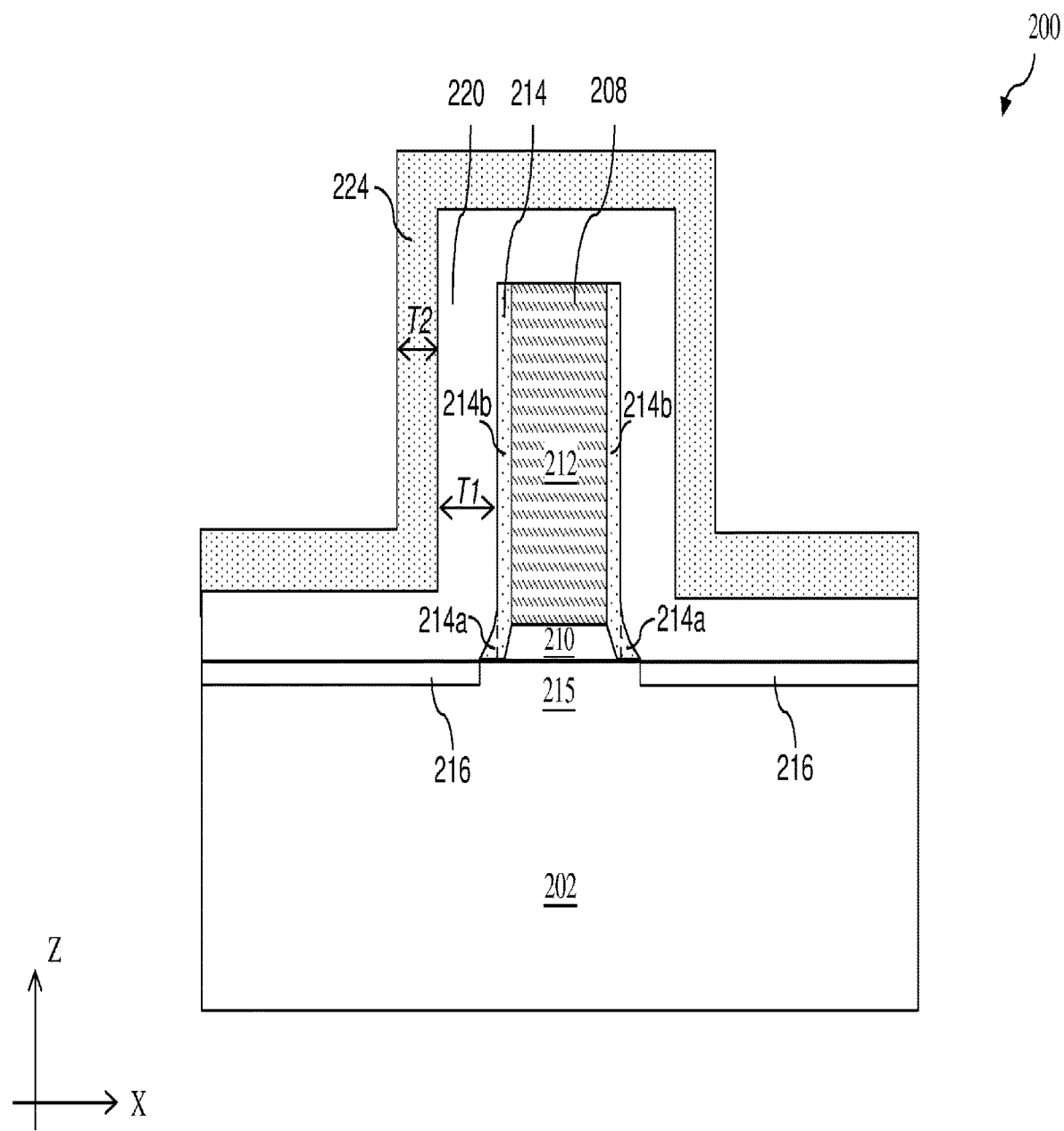

At operation 112, the method 100 (FIG. 1A) forms a hard mask layer 224 covering the gate spacer layer 220 (FIG. 6). The hard mask layer 224 may include a dielectric material such as silicon nitride, silicon oxide, silicon oxynitride, silicon carbonitride, silicon carbon oxynitride, other dielectric materials, or combination thereof. The composition of the hard mask layer 224 is selected such that the hard mask layer 224 has some etch selectivity with respect to the gate spacer layer 220. In some embodiments, the hard mask layer 224 includes silicon nitride (e.g., $Si_3N_4$). The hard mask layer 224 may be formed by any suitable technique including PECVD, LPCVD, and ALD. In the illustrated embodiment, the hard mask layer 224 is deposited by an LPCVD process. The hard mask layer 224 may be deposited to a thickness $T_2$ in a ratio of about 10% to about 70% of the channel region 215's length D. In some embodiments, the thickness $T_2$ is within a range of about 3 nm to about 20 nm, such as about 4 nm. In some embodiments, the hard mask layer 224 is thinner than the gate spacer layer 220 ($T_2<T_1$), such as thinner by up to 1 nm.

Figure 7:
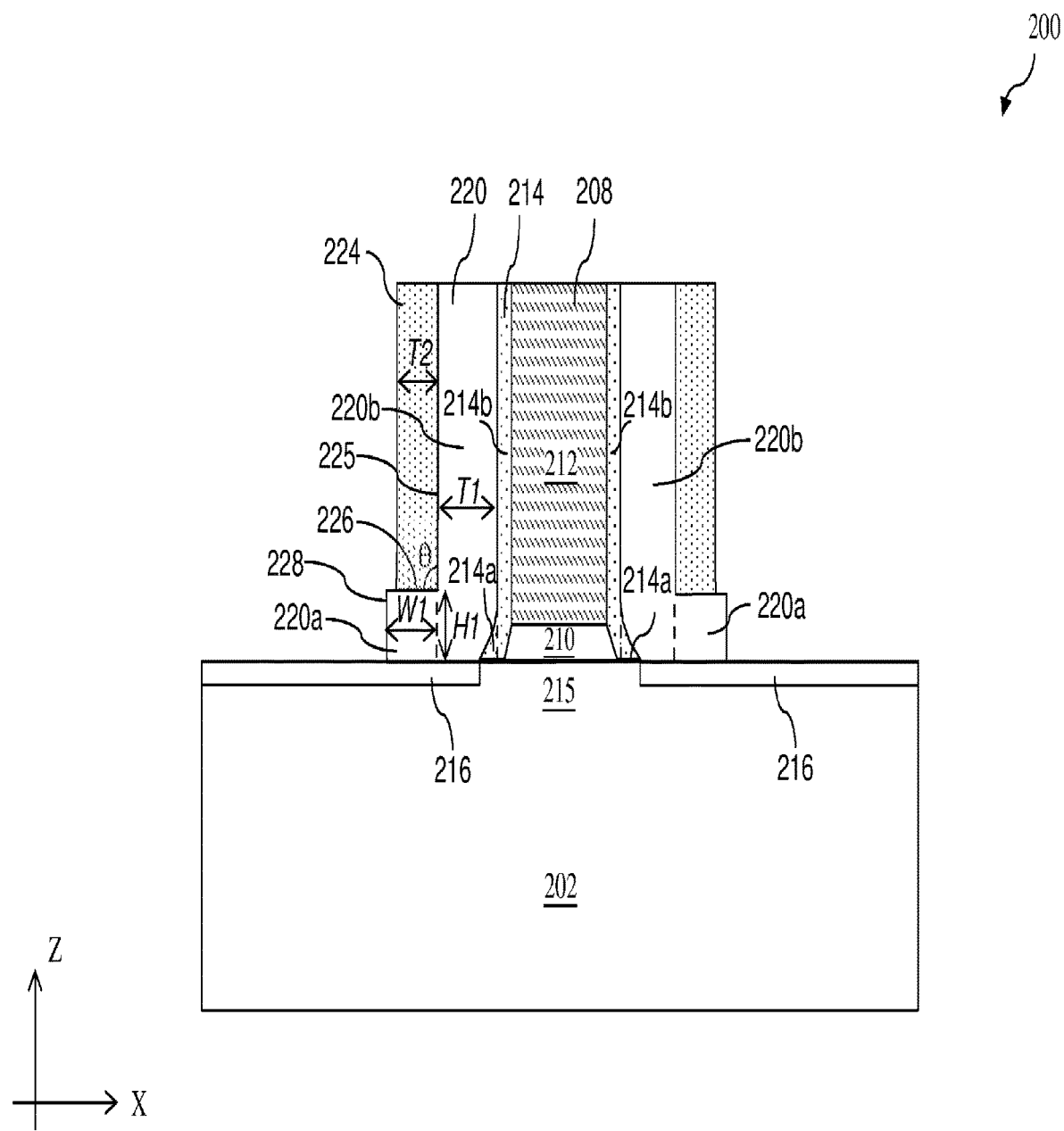

At operation 114, the method 100 (FIG. 1A) applies an etching process to the hard mask layer 224 and the gate spacer layer 220 (FIG. 7). The etching process includes an anisotropic etching in an embodiment. A portion of the hard mask layer 224 on the sidewalls of the gate spacer layer 220 remains substantially un-etched due to the highly directional etching, as shown in FIG. 7. In an embodiment where the hard mask layer 224 includes silicon nitride, operation 114 may employ a remote $O_2/N_2$ discharge with a fluorine-containing gas such as $CF_4$, $NF_3$, or $SF_6$, and may additionally include hydrogen ($H_2$) or $CH_4$. The anisotropic etching may further etch the gate spacer layer 220 exposed after the removal of portions of the hard mask layer 224. Alternatively, the etching process may include multiple etching steps with different etching chemistries, such as an anisotropic etching targeting a particular material of the hard mask layer 224 and subsequently a wet etching or dry etching targeting the gate spacer layer 220 using the un-etched hard mask layer 224 as an etching mask. The top surface of the gate stack 208 may or may not be exposed by this etching process.

Still referring to FIG. 7, the patterned gate spacer layer 220 can be denoted as the gate spacer 220 for the sake of simplicity, while the patterned hard mask layer 224 can be denoted as the hard mask 224. The gate spacer 220 includes a horizontal portion 220a that is directly under the hard mask 224 and a vertical portion 220b that covers sidewalls of the seal spacer 214. The vertical portion 220b includes a sidewall 225. The sidewall 225 is covered by the hard mask 224. In some embodiments, the sidewall 225 is substantially perpendicular (i.e., along the Z axis) to the top surface of the substrate 202. The horizontal portion 220a includes a top surface 226 and a sidewall 228. The sidewall 228 may be substantially perpendicular (i.e., along the Z axis) to the top surface of the substrate 202. The sidewall 225, the top surface 226, and the sidewall 228 form a step profile. The hard mask 224 is disposed directly above the top surface 226. In one embodiment, the hard mask 224 fully covers the top surface 226. In another embodiment, the hard mask 224 is thinner than the width $W_1$ of the horizontal portion 220a ($T_2<W_1$), such as due to higher sidewall etching loss of the hard mask 224 during operation 114. Therefore, a portion of the top surface 226 adjacent to the sidewall 228 is exposed, and may have a width about 0.5 nm to about 2 nm along the X axis. The top surface 226 intersects the sidewall 225, forming an angle $\Theta$ between the top surface 226 and the sidewall 225. In some embodiments, the angle $\Theta$ is within a range of about 85 degrees to about 95 degrees and the top surface 226 can be considered as substantially perpendicular to the sidewall 225. In various embodiments, the height $H_1$ of the horizontal portion 220a is in a ratio of about 10% to about 70% of the channel region 215's length D. In a particular embodiment, the height $H_1$ is the same as the thickness $T_1$ of the vertical portion 220b ($H_1=T_1$). In one embodiment, the height $H_1$ is different from the thickness $T_1$ of the vertical portion 220b ($H_1 \neq T_1$), such as $H_1$ is 1 nm less or more than the thickness $T_1$. A topmost point of the horizontal portion 220a may be higher than a topmost point of the horizontal portion 214a of the seal spacer 214.

Figure 8:
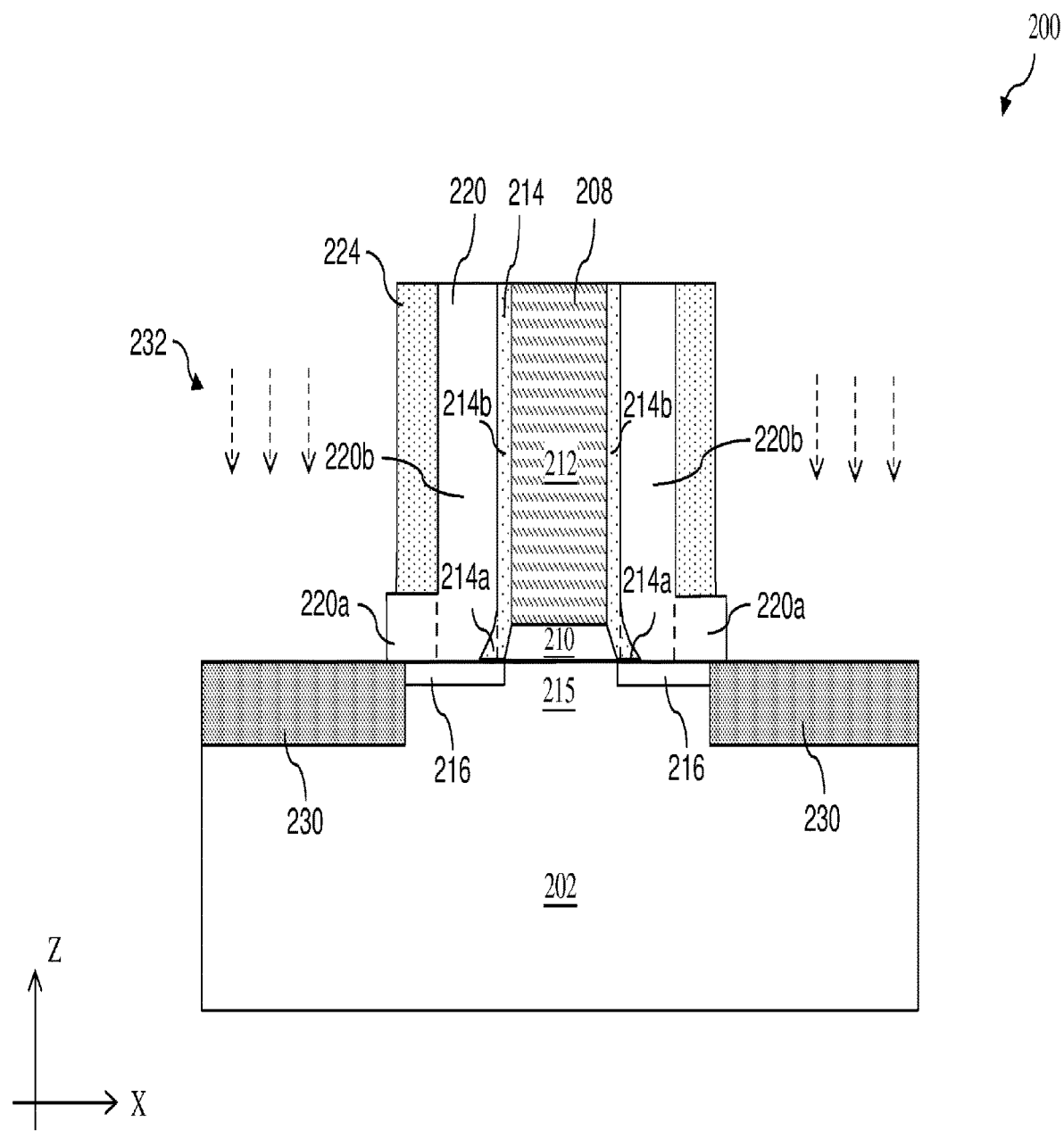

At operation 118, the method 100 (FIG. 1B) forms heavily doped source/drain (HDD) regions 230 in the substrate 202 (FIG. 8). The HDD regions 230 may be n-type doped regions and/or p-type doped regions for forming active devices. The HDD regions 230 and the LDD regions 216 are collectively regarded as source/drain (S/D) regions. The HDD regions 230 are more heavily doped than the LDD regions 216. The HDD regions 230 may be formed by performing ion implantation process 232. The ion implantation process 232 may utilize n-type dopants, such as phosphorus (P) or arsenic (As), for the NFETs, or p-type dopants, such as boron (B) or indium (In), for the PFETs. The HDD regions 230 are self-aligned with the gate stack 208 and the gate spacer 220. A mask layer (not shown) may be used to cover other regions of the substrate 202 when the HDD regions 230 are subject to the ion implantation process 232. In some embodiments, the mask layer is a patterned photoresist. In some embodiments, the mask layer is a patterned hard mask of a material, such as silicon oxide, silicon nitride, silicon oxynitride or a combination thereof. The mask layer is removed after the HDD implantation has completed in the HDD regions 230.

Figure 9:
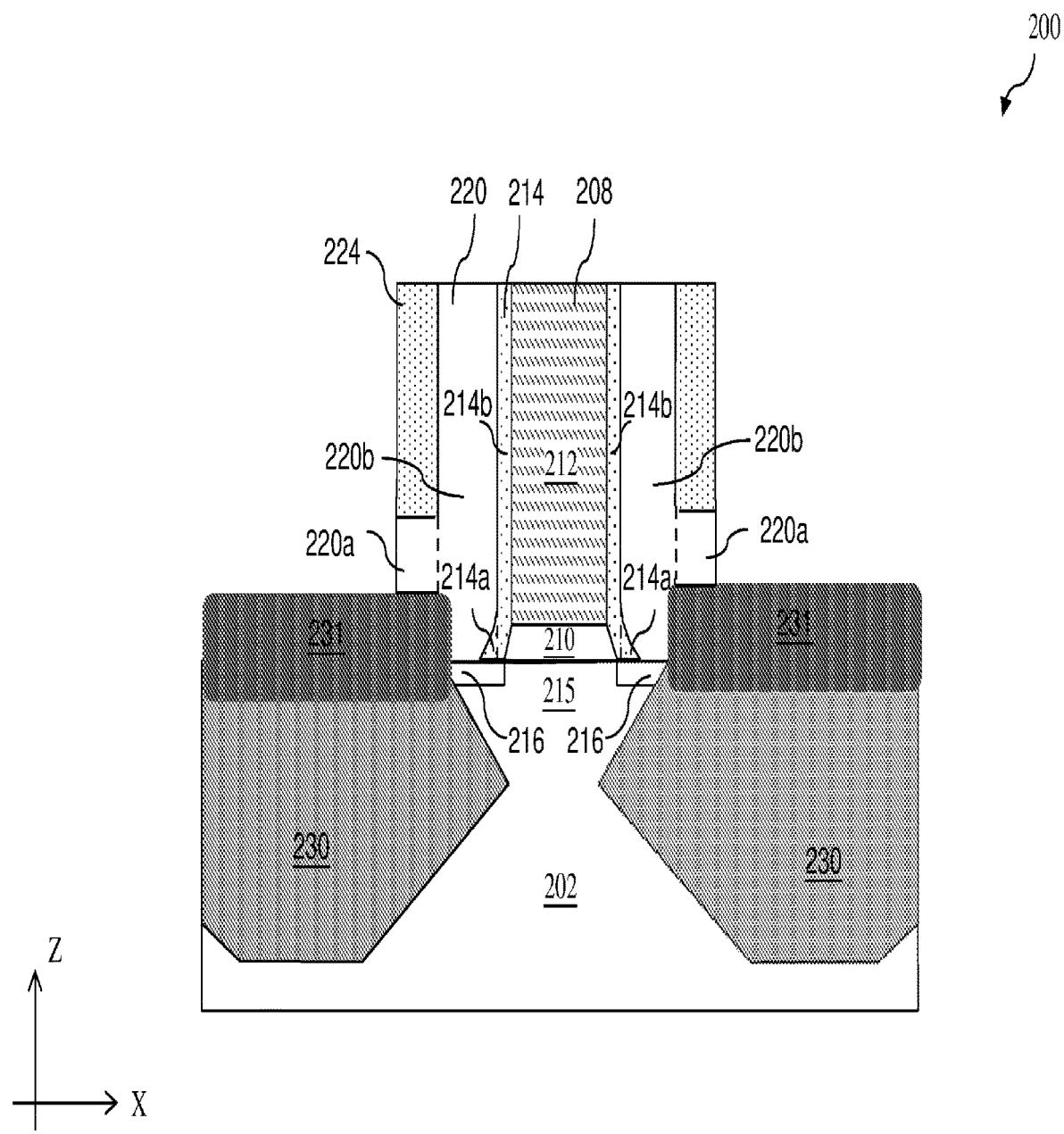

The forming of the HDD regions 230 may also include first etching S/D recesses in the substrate 202 followed by epitaxially growing HDD regions 230 in the respective recesses. In some embodiment where the gate stack 208 and the gate spacer 220 are thicker than desired, the HDD regions 230 can be formed to have a substantially diamond-shaped profile, such as the HDD regions 230 in FIG. 9. Referring to FIG. 9, some sidewalls of the HDD regions 230 are extended towards the gate stack 208 underneath the gate spacer 220, such as under the vertical portion 220b. In one example, the HDD regions 230 are further extended under the horizontal portion 214a of the seal spacer 214, but not under its vertical portion 214b. In another example, the HDD regions 230 are further extended under the gate stack 208. In one example, the S/D recesses are formed with an etching process that includes both a dry etching and a wet etching process where etching parameters thereof are tuned (such as etchants used, etching temperature, etching solution concentration, etching pressure, source power, radio frequency (RF) bias voltage, RF bias power, etchant flow rate, and other suitable parameters) to achieve the desired recess profile. The HDD regions 230 may include a salicide portion 231 on the top surface. Parts of the silicide portion 231 may be covered by the horizontal portion 220a and/or vertical portion 220b of the gate spacer 220. Due to the elevated height of the silicide portion 231, a bottom surface of the horizontal portion 220a may be higher than a bottom surface of the vertical portion 220b. For the convenience of discussion, the device 200 with the HDD regions in a shape as shown in FIG. 8 is used as an example for subsequent operations. Persons having ordinary skill in the art should recognize that the device 200 with the HDD regions in a shape as shown in FIG. 9 can also be used for the subsequent operations.

Referring back to FIG. 8, in an embodiment, the HDD regions 230 further include silicidation or germanosilicidation (not shown). For example, silicidation may be formed by a process that includes depositing a metal layer, annealing the metal layer such that the metal layer reacts with silicon to form silicide, and then removing the non-reacted metal layer. Operation 118 may further include one or more annealing processes to activate the S/D regions. After the activation, the LDD regions 216 may be extended towards the gate stack 208 underneath the seal spacer 214, and the HDD regions 230 may be extended partially underneath the horizontal portion 220a of the gate spacer 220. In other words, the seal spacer 214 and the vertical portion 214b of the gate spacer 220 may be in physical contact with the LDD regions 216, and the horizontal portion 220a of the gate spacer 220 may be in physical contact with both the LDD regions 216 and the HDD regions 230. The low dielectric constant of the material composition of the gate spacer 220 also helps decrease interface stress between the gate stack and source/drain regions and therefore improve channel carrier mobility. In an embodiment, the device 200 includes fin-like active regions for forming multi-gate FETs such as FinFETs. To further this embodiment, the S/D regions and the channel region 215 may be formed in or on the fins. The channel region 215 is under the gate stack 208 and interposed between a pair of LDD regions 216. The channel region 215 conducts currents between the respective S/D regions when the semiconductor device 200 turns on, such as by biasing the gate electrode layer 212.

Figure 10:
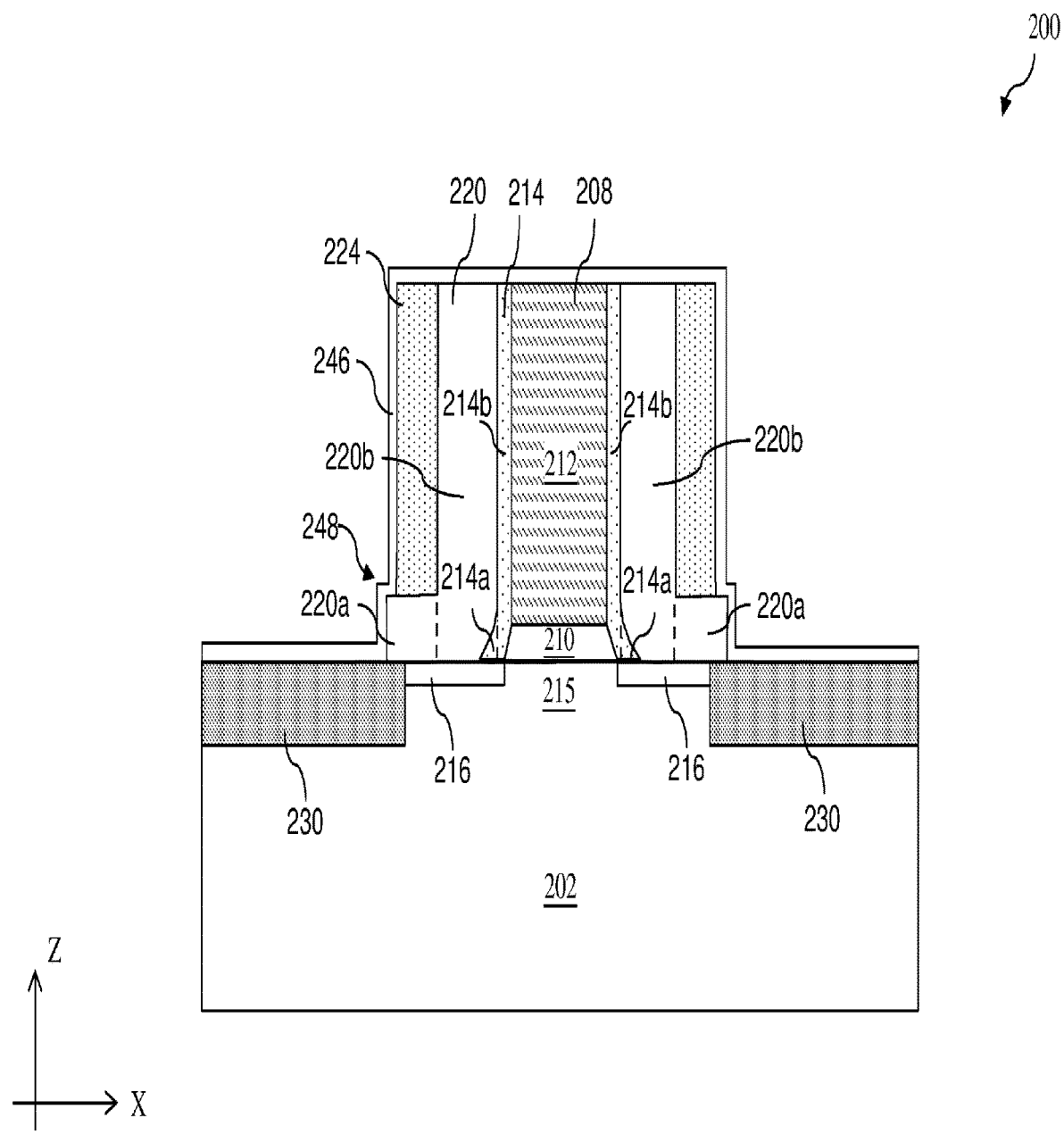

At operation 120, the method 100 (FIG. 1B) forms a contact etch stop (CES) layer 246 covering the device 200 (FIG. 10). In the illustrated embodiment, the CES layer 246 is deposited as a blanket layer over the sidewalls and top of the gate spacer 220, the hard mask 224, the seal spacer 214, the gate stack 208, and over the top surface of the HDD regions 230. The CES layer 246 may include a dielectric material such as silicon nitride, silicon oxide, silicon oxynitride, silicon carbonitride, silicon carbon oxynitride, other dielectric materials, or combination thereof. The CES layer 246 may be formed by a plasma-enhanced CVD (PECVD) process and/or other suitable deposition or oxidation processes. In the illustrated embodiment, the hard mask 224 and the CES layer 246 both include silicon nitride (e.g., $Si_3N_4$), while the hard mask 224 is formed by LPCVD and the CES layer 246 is formed by PECVD, therefore the silicon nitride material has different crystalline structure (e.g., different lattice constants) in the hard mask 224 and the CES layer 246. In one particular embodiment, the CES layer 246 has a step profile 248 along its vertical sidewall, due to the sidewall profile of the horizontal portion 220a and the hard mask 224 underneath the CES layer 246.

Figure 11:
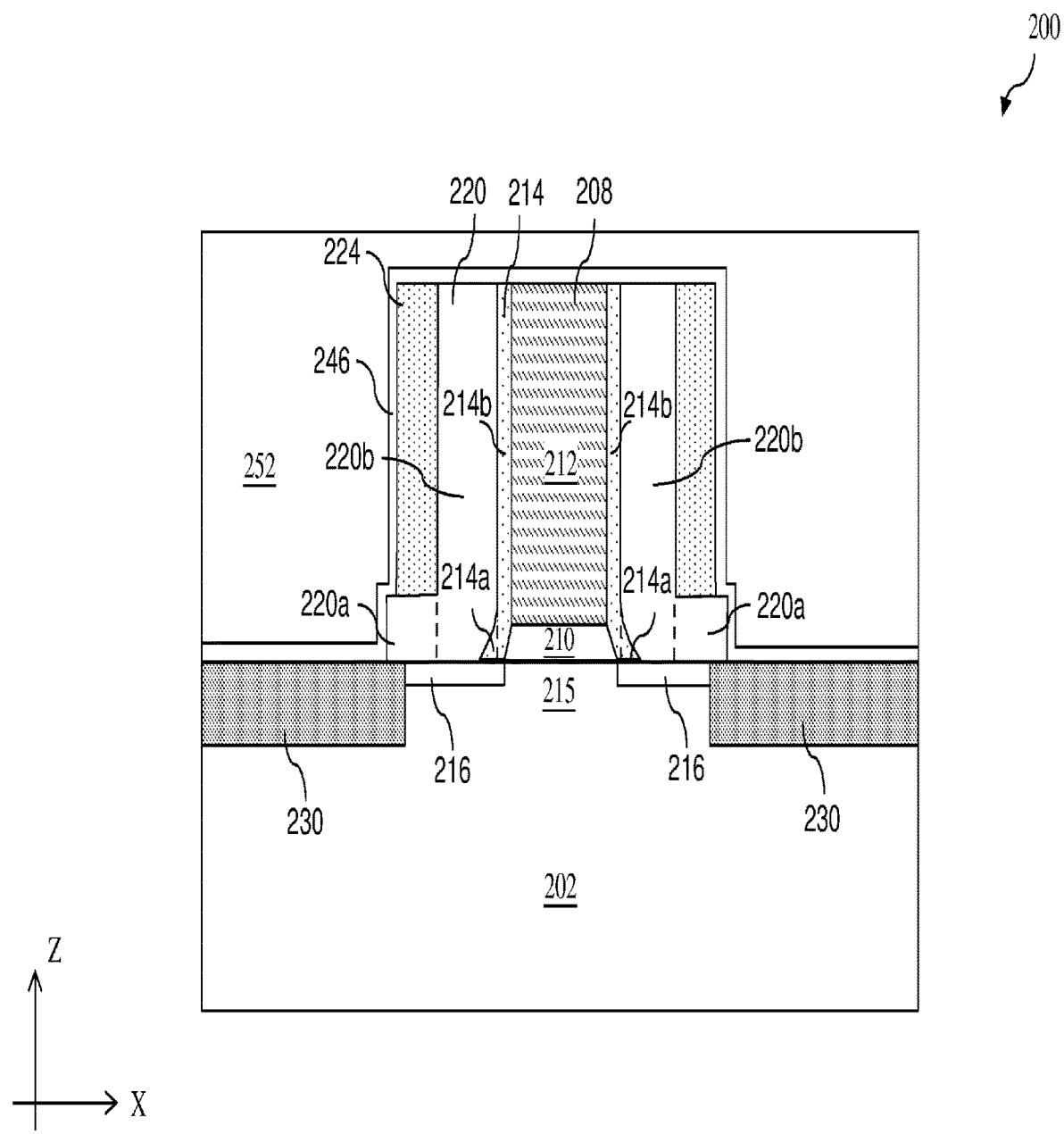

At operation 122, the method 100 (FIG. 1B) forms an inter-layer dielectric (ILD) layer 252 over the CES layer 246 (FIG. 11). The ILD layer 252 may include materials such as silicon oxide, doped silicon oxide such as borophosphosilicate glass (BPSG), tetraethylorthosilicate (TEOS) oxide, un-doped silicate glass, fused silica glass (FSG), phosphosilicate glass (PSG), boron doped silicon glass (BSG), low-k dielectric material, and/or other suitable dielectric materials. The ILD layer 222 may be deposited by a PECVD process, a flowable CVD (FCVD) process, or other suitable deposition technique. The composition of the CES layer 246 and the ILD layer 252 are selected such that the CES layer 246 has some etch selectivity with respect to the ILD layer 252.

Figure 12:
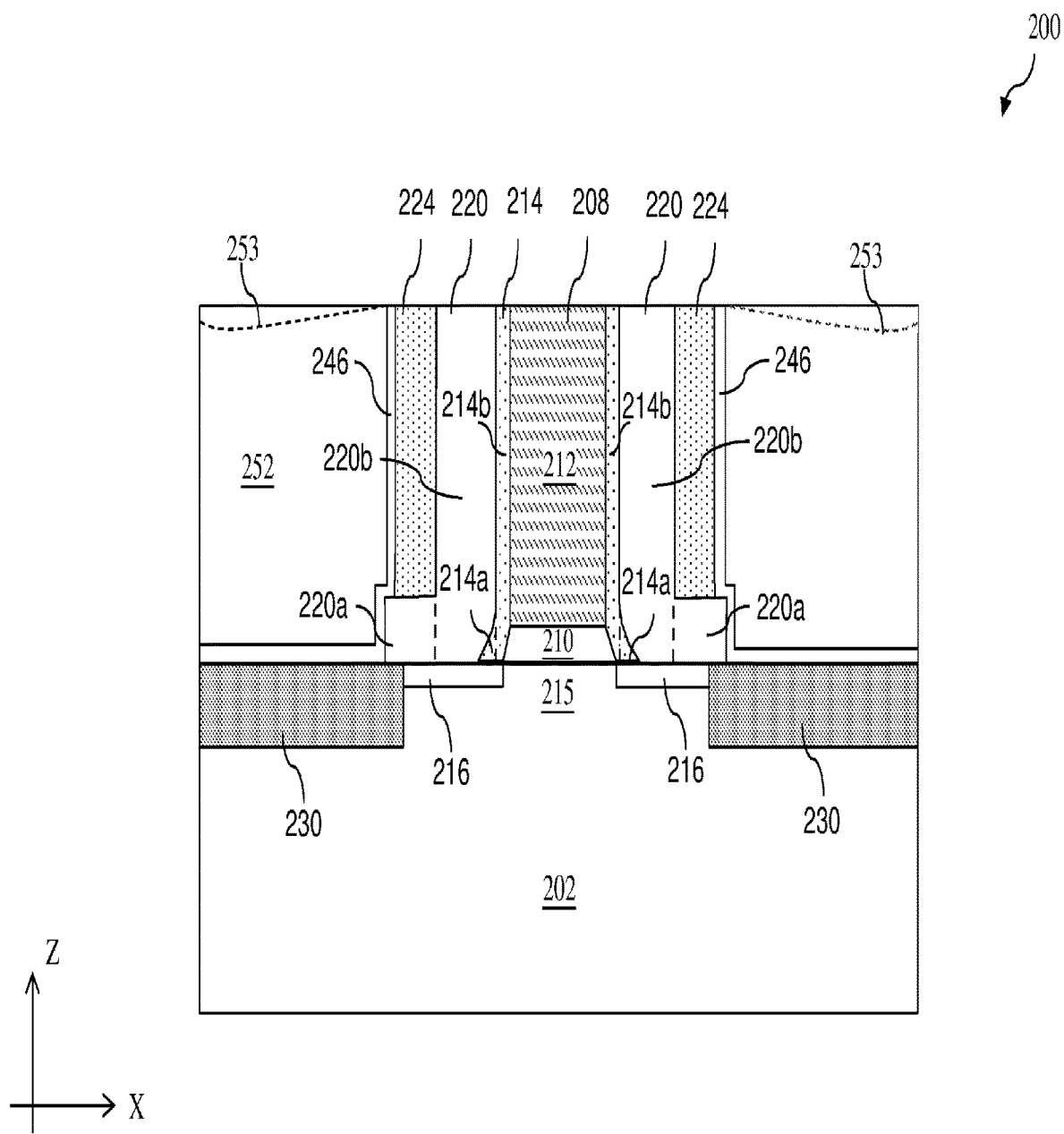

At operation 124, the method 100 (FIG. 1B) performs one or more chemical mechanical planarization (CMP) processes to polish the ILD layer 252 and to expose the gate stack 208 (FIG. 12). In some embodiments, the ILD layer 252 have higher surface loss during planarization compared to the gate stack 208, such as due to relatively lower material density, and the top surface of the ILD layer 252 has a concave profile, as illustrated by the dotted line 253. A bottommost portion of the top surface of the ILD layer 252 may be lower than the top surface of the gate stack 208 in a range within about 0.1 nm to about 25 nm.

At operation 126, the method 100 (FIG. 1B) proceeds to further processes in order to complete the fabrication of the device 200. For example, the method 100 may form metal gate stack in a replacement gate process.

In the replacement gate process, the gate stack 208 is a temporary gate structure. The temporary gate structure may be formed by deposition and etching processes. Subsequently, operation 126 removes the temporary gate structure to form a gate trench (not shown) between the seal spacer

Figure 13:
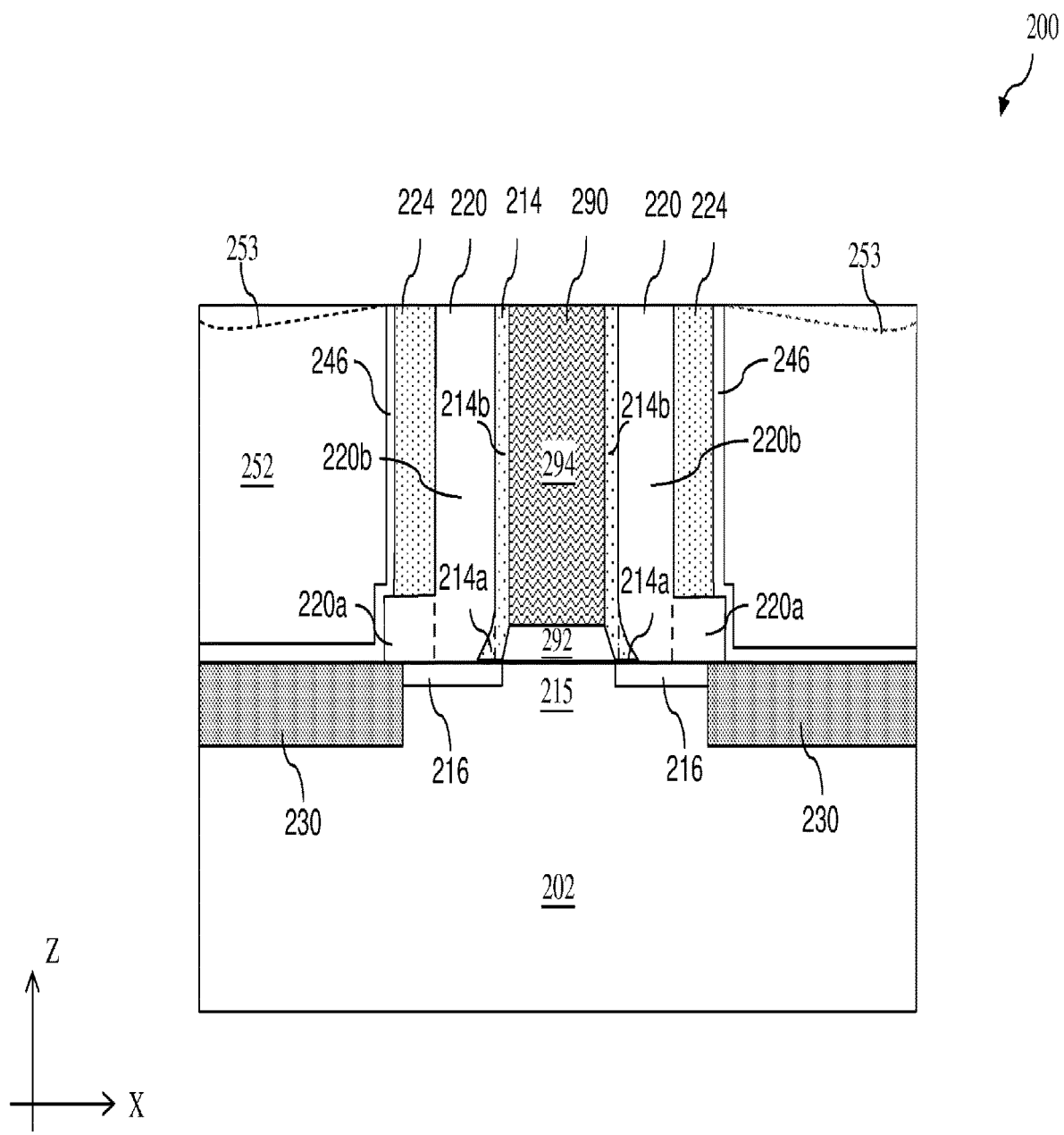

214 and deposits a high-k metal gate stack 290 in the gate trench (FIG. 13). The high-k metal gate stack 290 may include a high-k dielectric layer 292 and a conductive layer 294 thereon. The high-k metal gate stack 290 may further include an interfacial layer (e.g., $SiO_2$) (not shown) between the high-k dielectric layer 292 and the channel region 215. The interfacial layer may be formed using chemical oxidation, thermal oxidation, ALD, CVD, and/or other suitable methods.

The high-k dielectric layer 292 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k dielectric layer 292 may be deposited using CVD, ALD and/or other suitable methods.

The conductive layer 294 may include one or more metal layers, such as work function metal layer(s), conductive barrier layer(s), and metal fill layer(s). The work function metal layer may be a p-type or an n-type work function layer depending on the type (p-type or n-type) of the transistor. The p-type work function layer comprises a metal selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials. The conductive layer 294 may be deposited using methods such as CVD, PVD, plating, and/or other suitable processes.

Operation 126 may include other processes in order to complete the fabrication of the device 200. For example, the operation 126 may form S/D contacts (not shown) and form multi-layer interconnect structure that connects the gate stacks and the S/D contacts with other parts of the device 200 to form a complete IC.

Figure 14:
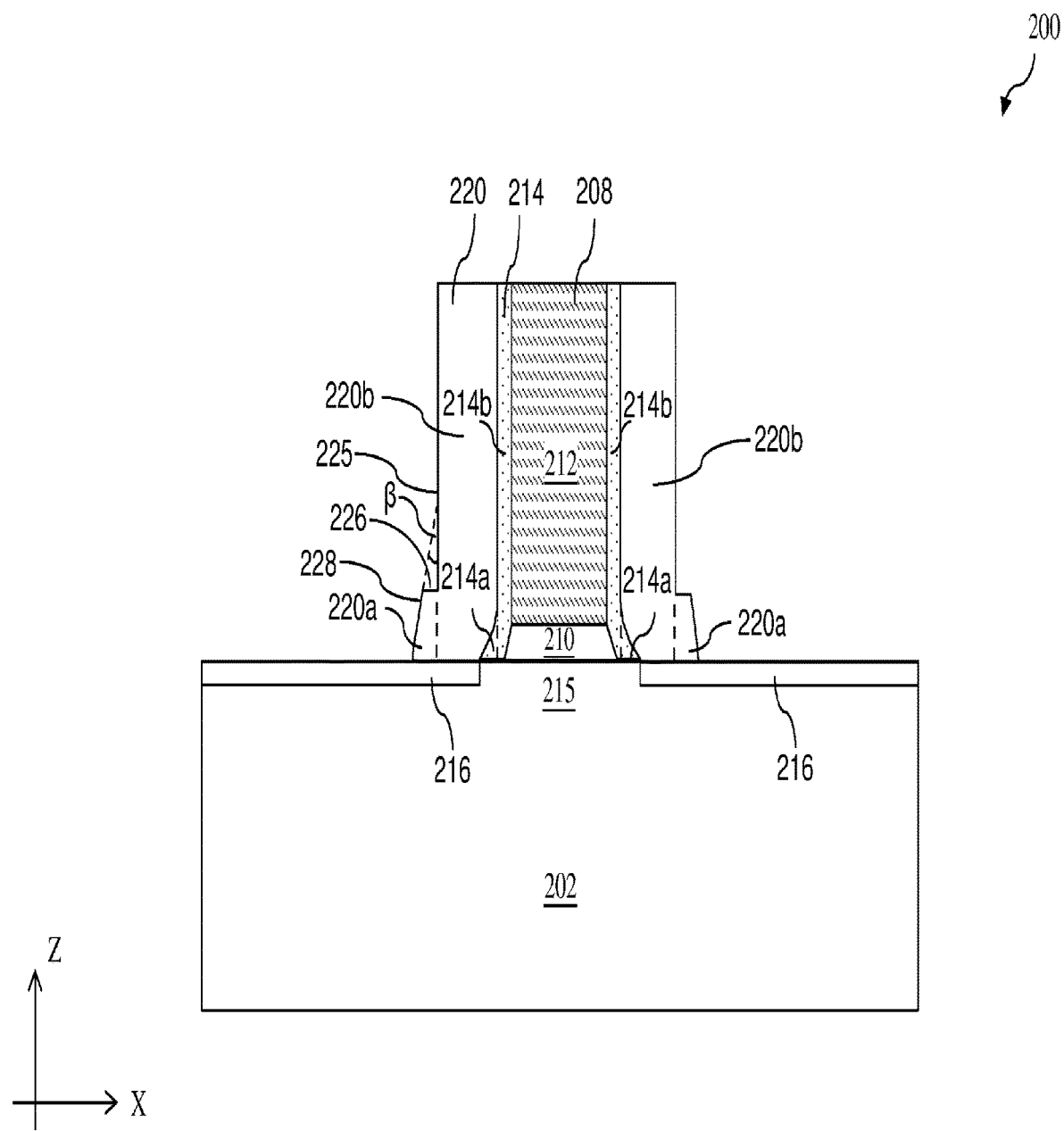

The method 100 may have various embodiments. For example, the method 100 may have an optional operation 116 (FIG. 1C) between operations 114 and 118 to remove the hard mask 224 from sidewalls of the gate spacer 220, as shown in FIG. 14. In the illustrated embodiment, the hard mask 224 includes silicon nitride, which has higher dielectric constant than the material compositions of the gate spacer 220. By removing the hard mask 224, the overall dielectric constant of the isolation material between the gate stack 208 and source/drain contacts (not shown) is further reduced, resulting in even lower stray capacitances among FET features.

Figure 15:
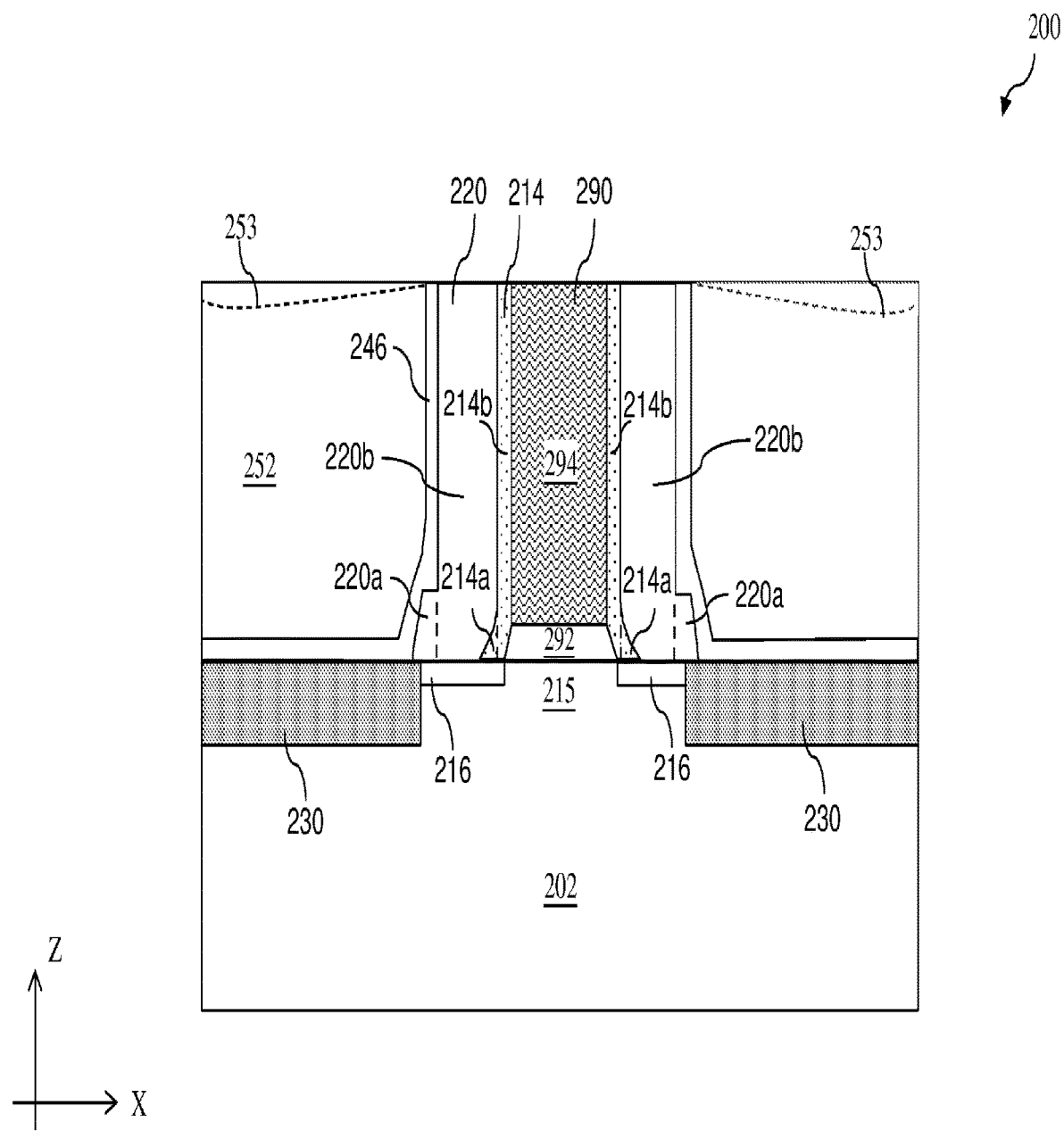
Figure 16:
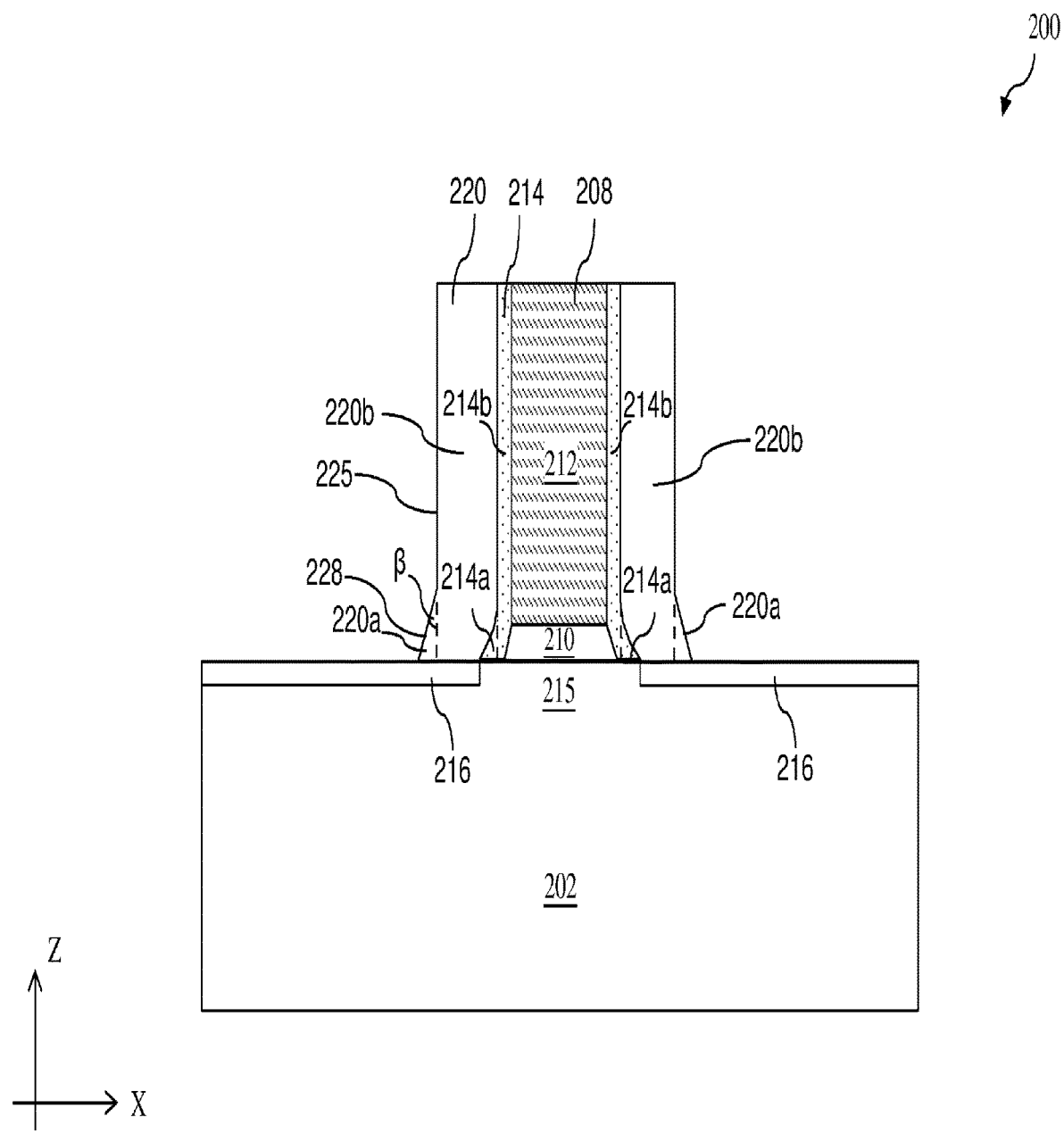
Figure 17:
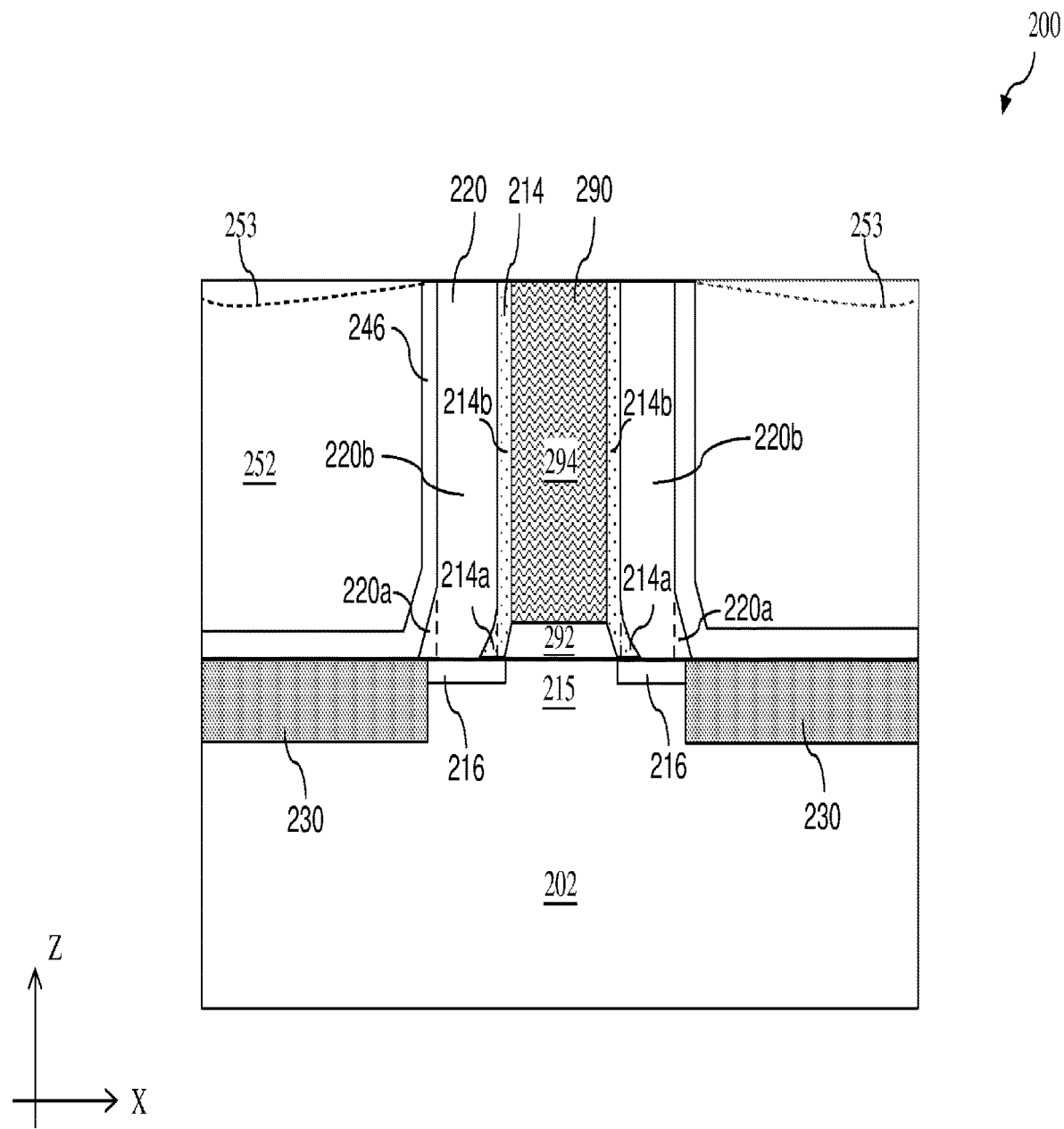

The removing of the hard mask 224 may include any suitable etching technique such as wet etching, dry etching, RIE, ashing, and/or other etching processes. In some embodiments, etchant is selected such that the hard mask 224 and the gate spacer 220 have a high etch selectivity. For example, the etch selectivity between the hard mask 224 and the gate spacer 220 has a ratio about 5:1 or larger, such as ranging from 5:1 to 20:1. The etching process may also trim the profile of the horizontal portion 220a of the gate spacer 220. In one embodiment, the top surface 226 is shortened to a ratio of about 3% to about 30% of the channel region 215's length D, such as about 1 nm to about 8 nm (e.g., 2 nm), and the sidewall 228 becomes tapering with an angle β less than 45 degrees with respect to the sidewall 225, such as about 20 degrees. The method 100 may subsequently proceed to operations 118, 120, 122, 124, and 126 as described above, to form other features of the device 200, including forming HDD regions 230 using the trimmed gate spacer 220 as a mask, depositing the CES layer 246 directly above sidewalls of the trimmed gate spacer 220, and forming the ILD layer 252 on device 200, as shown in FIG. 15. In another embodiment, operation 116 (FIG. 1C) trims away the top surface 226 of the horizontal portion 220a, such that the sidewall 228 directly interests the sidewall 225 with an angle β less than 45 degrees such as about 20 degrees as shown in FIG. 16. The method 100 may subsequently proceed to operations 118, 120, 122, 124, and 126, which would not be repeated here for the sake of simplicity, to proceed to form other features of the device 200, as shown in FIG. 17.

Although not intended to be limiting, one or more embodiments of the present disclosure provide many benefits to a semiconductor device and the formation thereof, including fin-type field effect transistors (FinFETs). For example, the fins may be patterned to produce a relatively close spacing between features, for which the above disclosure is well suited. Gate spacers used in forming fins of FinFETs can be processed according to the above disclosure. For example, embodiments of the present disclosure provide a method of forming low-k gate spacers surrounding the gate stack. The dielectric constant of the isolation materials between the gate stack and source/drain contacts is lowered, which reduces interference, noise, and parasitic coupling capacitance between interconnects. In addition, the low-k gate spacer structures help decrease interface stress between gate stacks and source/drain regions and therefore improve channel carrier mobility. Further, the disclosed methods can be easily integrated into existing semiconductor manufacturing processes.

In one exemplary aspect, the present disclosure is directed to a semiconductor device. In an embodiment, the semiconductor device includes a substrate having a channel region; a gate stack over the channel region; a seal spacer covering a sidewall of the gate stack, the seal spacer including silicon nitride; a gate spacer covering a sidewall of the seal spacer, the gate spacer including silicon oxide, the gate spacer having a first vertical portion and a first horizontal portion; and a first dielectric layer covering a sidewall of the gate spacer, the first dielectric layer including silicon nitride. In an embodiment, the seal spacer includes a second vertical portion and a second horizontal portion; and the first dielectric layer includes a third vertical portion and a third horizontal portion. In an embodiment, each of the first, second, and third horizontal portions is in physical contact with a top surface of the substrate. In an embodiment, the topmost point of the second horizontal portion is lower than a topmost point of the first horizontal portion. In an embodiment, the substrate has a source/drain (S/D) region, the S/D region having a first doped S/D region adjacent to the channel region and a second doped S/D region adjacent to the first doped S/D region, wherein the second doped S/D region is more heavily doped than the first doped S/D region; the first vertical portion is offset from the second doped S/D region and in physical contact with the first doped S/D region; and the first horizontal portion is in physical contact with both the first doped S/D region and the second doped S/D region. In an embodiment, a height of the first horizontal portion is substantially the same as a width of the first vertical portion. In an embodiment, the first vertical portion has a first sidewall, the first sidewall being substantially perpendicular to a top surface of the substrate; and the first horizontal portion has a second sidewall, the second sidewall intersects the first sidewall at an angle less than 45 degrees. In an embodiment, the first vertical portion has a first sidewall, the first sidewall being substantially perpendicular to a top surface of the substrate; and the first horizontal portion has a second sidewall and a first top surface interposed between the first sidewall and the second sidewall, the first top surface being substantially perpendicular to the first sidewall. In an embodiment, the semiconductor device further includes a second dielectric layer interposed between the gate spacer and the first dielectric layer, the second dielectric layer being above the first horizontal portion, the second dielectric layer and the gate spacer having different material compositions. In an embodiment, the second dielectric layer partially covers the first top surface. In an embodiment, the second sidewall is substantially perpendicular to a top surface of the substrate. In an embodiment, the gate stack includes a polysilicon gate or a metal gate.

In another exemplary aspect, the present disclosure is directed to a semiconductor device. In an embodiment, the semiconductor device includes a substrate having source/drain (S/D) regions with a channel region interposed between the S/D regions; a gate stack over the channel region; a dielectric layer covering sidewalls of the gate stack, the dielectric layer including a nitride; a spacer layer covering sidewalls of the dielectric layer, the spacer layer including an oxide, wherein a sidewall of the spacer layer includes an upper sidewall, a horizontal surface, and an lower sidewall, thereby forming a step profile; and a contact etch stop (CES) layer covering the sidewall of the spacer layer, the CES layer including a nitride. In an embodiment, the upper sidewall intersects the horizontal surface, defining an angle between the upper sidewall and the horizontal surface, the angle being in a range from 85 degrees to 95 degrees. In an embodiment, the semiconductor device of claim further includes a hard mask layer disposed between the spacer layer and the CES layer, a dielectric constant of the hard mask layer being higher than a dielectric constant of the spacer layer. In an embodiment, the S/D regions include a first doped S/D region and a second doped S/D region that is more heavily doped than the first doped S/D region, wherein the upper sidewall is directly above the first doped S/D region, and the lower sidewall is directly above the second doped S/D region. In an embodiment, a thickness of the spacer layer ranges from 10% to 70% of a length of the channel region.

In yet another exemplary aspect, the present disclosure is directed to a method. In an embodiment, the method includes forming a gate structure on a substrate; forming a seal spacer covering the gate structure; forming a gate spacer covering the seal spacer by an atomic layer deposition (ALD) process, the gate spacer having a first vertical portion and a first horizontal portion; forming a hard mask layer covering the gate spacer, the hard mask layer having a second vertical portion and a second horizontal portion; removing the second horizontal portion of the hard mask layer and part of the first horizontal portion of the gate spacer that is under the second horizontal portion of the hard mask layer; and forming a contact etch stop (CES) layer covering the gate spacer. In an embodiment, the method further includes prior to the forming of the CES layer, removing the second vertical portion of the hard mask layer. In an embodiment, the gate spacer has the lowest dielectric constant in the group of the seal spacer, the gate spacer, the hard mask layer, and the CES layer. In an embodiment, the seal spacer includes silicon nitride; the gate spacer includes silicon oxide; and the CES layer includes silicon nitride. In an embodiment, the method further includes after the forming of the seal spacer and prior to the forming of the gate spacer, forming a first source/drain region by an ion implantation process; and after the removing of the second horizontal portion of the hard mask layer and prior to the forming of the CES layer, forming a second source/drain region adjacent to the first source/drain region, wherein the second source/drain region is more heavily doped than the first source/drain region. In an embodiment, the gate structure is a polysilicon gate structure or a metal gate structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate having a channel region, the substrate further including a source/drain (S/D) region, the S/D region having a first doped S/D region adjacent to the channel region and a second doped S/D region adjacent to the first doped S/D region, wherein the second doped S/D region is more heavily doped than the first doped S/D region;
   a gate stack over the channel region, the gate stack including a gate electrode;
   a seal spacer disposed along a sidewall of the gate stack and physically contacting the gate electrode, the seal spacer formed of a first material;
   a gate spacer disposed along a sidewall of the seal spacer, the gate spacer formed of a second material that is different than the first material, the gate spacer having a first vertical portion and a first horizontal portion, the first vertical portion offset from the second doped S/D region and in physical contact with the first doped S/D region, the first horizontal portion in physical contact with both the first doped S/D region and the second doped S/D region; and
   a first dielectric layer covering a sidewall of the gate spacer, the first dielectric layer formed of a third material that is different than the second material.

2. The device of claim 1, wherein the first material is silicon nitride, and
   wherein the second material is an oxide material.

3. The device of claim 2, wherein the third material is silicon nitride.

4. The device of claim 1, wherein the first horizontal portion of the gate spacer has a top surface facing away from the substrate, and
   wherein a portion of the first dielectric layer physically contacts the top surface of the first horizontal portion of the gate spacer.

5. The device of claim 4, further comprising a contact etch stop layer disposed along a sidewall of the first dielectric layer and physically contacting the top surface of the first horizontal portion of the gate spacer.

6. The device of claim 5, wherein the contact etch stop layer extends to the second doped S/D region.

7. The device of claim 1, further comprising a silicide feature disposed over the second doped S/D region,
   wherein the first horizontal portion of the gate spacer is disposed over a top surface of the silicide feature, the top surface of the silicide feature facing away from the substrate, and
   wherein the first vertical portion of the gate spacer is disposed along a side edge of the silicide feature.

8. A semiconductor device, comprising:
   a first doped S/D region and a second doped S/D region disposed in a substrate, the second doped S/D region being more heavily doped than the first doped S/D region,
   a gate stack disposed over the substrate and associated with the first doped S/D region and the second doped S/D region;
   a dielectric layer covering a sidewall of the gate stack, the dielectric layer including a first material, the dielectric layer having a sidewall facing away from the gate stack and wherein a lower portion of the sidewall of the dielectric layer tapers away from the gate stack; and
   a spacer layer physically contacting the sidewall of the dielectric layer, the spacer layer including a second material that is different from the first material, wherein a sidewall of the spacer layer includes an upper sidewall, a horizontal surface, and a lower sidewall, thereby forming a first step profile, wherein the upper sidewall is directly above the first doped S/D region, and the lower sidewall is directly above the second doped S/D region.

9. The device of claim 8, wherein the dielectric layer physically contacts the first doped S/D region.

10. The device of claim 9, wherein the spacer layer physically contacts the first doped S/D region and the second doped S/D region.

11. The device of claim 8, wherein the first material is nitride and the second material is oxide.

12. The device of claim 8, further comprising a contact etch stop layer physically contacting the upper sidewall, the horizontal surface, and the lower sidewall of the spacer layer, and
   wherein the contact etch stop layer includes a sidewall facing away from the gate stack and wherein a lower portion of the sidewall of the contact etch stop layer tapers away from the gate stack.

13. The device of claim 8, further comprising a contact etch stop layer physically contacting the upper sidewall, the horizontal surface, and the lower sidewall of the spacer layer, and
   wherein a sidewall of the contact etch stop layer includes an upper sidewall, a horizontal surface, and a lower sidewall, thereby forming a second step profile, wherein the upper sidewall, the horizontal surface and the lower sidewall are directly above the second doped S/D region.

14. The device of claim 8, further comprising a hard mask layer disposed directly on the horizontal surface of the spacer layer, wherein a first portion of the hard mask layer is directly above the first doped S/D region and a second portion of the hard mask layer is directly above the second doped S/D region.

15. A method comprising:
   forming a seal spacer covering a gate structure and a portion of a substrate;
   removing a portion of the seal spacer to expose the portion of the substrate, wherein a remaining portion of the seal spacer covering the gate structure has a sidewall facing away from the gate structure, wherein a lower portion of the sidewall of the seal spacer tapers away from the gate structure;
   forming a gate spacer layer covering the sidewall of the seal spacer and directly on the exposed portion of the substrate;
   forming a hard mask layer covering the gate spacer layer; and
   patterning the hard mask layer and the gate spacer layer to expose a first source/drain feature disposed in the substrate.

16. The method of claim 15, further comprising forming the first source/drain feature in the exposed portion of the substrate.

17. The method of claim 16, further comprising forming a second source/drain feature in the substrate adjacent the first source/drain feature after patterning the hard mask layer and the gate spacer layer to expose the first source/drain feature disposed in the substrate, the second source/drain feature being more heavily doped than the first source/drain feature.

18. The method of claim 17, wherein the patterned gate spacer physically contacts both the first source/drain feature and the second source/drain feature.

19. The method of claim 17, further comprising forming a contact etch stop layer on the patterned hard mask layer, the patterned gate spacer layer and on the second source/drain feature, the contact etch stop layer physically contacting the patterned hard mask layer, the patterned gate spacer layer and the second source/drain feature.

20. The method of claim 19, further comprising performing a planarization process to remove a portion of the contact etch stop layer to expose the patterned hard mask layer and the patterned gate spacer layer.

* * * * *